United States Patent
Ehlen et al.

(10) Patent No.: US 9,538,683 B2
(45) Date of Patent: Jan. 3, 2017

(54) CIRCUIT BOARD EJECTOR SYSTEM

(71) Applicant: Facebook, Inc., Menlo Park, CA (US)

(72) Inventors: Jon Brian Ehlen, Newark, CA (US); Jason David Adrian, San Jose, CA (US)

(73) Assignee: Facebook, Inc., Menlo Park, CA (US)

( * ) Notice: Subject to any disclaimer, the term of this patent is extended or adjusted under 35 U.S.C. 154(b) by 37 days.

(21) Appl. No.: 14/300,821

(22) Filed: Jun. 10, 2014

(65) Prior Publication Data

US 2015/0359125 A1 Dec. 10, 2015

(51) Int. Cl.
*H05K 5/00* (2006.01)
*H05K 7/14* (2006.01)

(52) U.S. Cl.
CPC .................................. *H05K 7/1409* (2013.01)

(58) Field of Classification Search
USPC .......................... 361/754, 752, 755; 439/157
See application file for complete search history.

(56) References Cited

U.S. PATENT DOCUMENTS 6,685,489 B1 * 2/2004 Rubenstein .......... H05K 7/1409
439/157

OTHER PUBLICATIONS

U.S. Appl. No. 14/704,166 of Chu, R., filed May 5, 2015.
Final Office Action mailed Apr. 20, 2016, for U.S. Appl. No. 14/300,821 of Ehlen, J. et al., filed Jun. 10, 2014.
U.S. Appl. No. 15/063,024 by Li, H. et al., filed Mar. 7, 2016.

* cited by examiner

*Primary Examiner* — Andargie M Aychillhum
(74) *Attorney, Agent, or Firm* — Perkins Coie LLP (57) ABSTRACT

Technology is provided for a circuit board ejector system. The circuit board ejector systems include a chassis, a circuit board housed in the chassis, and a pair of circuit board ejectors. The circuit board ejectors each include a hub rotatably mountable to the chassis and at least one ejector tooth extending from the hub. A lever is coupled to the hub, wherein the ejector tooth is mateable with the circuit board, whereby movement of the lever causes the tooth to move the circuit board between an installed position and an ejected position.

16 Claims, 6 Drawing Sheets

CIRCUIT BOARD EJECTOR SYSTEM

TECHNICAL FIELD

This patent application generally relates to data storage server configurations, and more specifically, to circuit board ejector systems.

BACKGROUND

Data centers are complex facilities including rows of data storage server racks. Each server rack has a three dimensional footprint which consumes valuable real estate. With all the power, cooling, and cabling infrastructure, data centers are expensive facilities to operate. Thus, each server rack's footprint should be used efficiently in order to reduce costs and maximize profit. The more storage devices housed within a server rack, the more efficient the use of the footprint. Accordingly, there is limited space in the server rack for other devices and components. For example, conventional circuit board ejectors are functional; however, they require significant space within a server rack. Accordingly, there is need for circuit board ejectors that consume less space within a server rack to facilitate storing more devices within the rack.

BRIEF DESCRIPTION OF THE DRAWINGS

The circuit board ejector systems introduced here may be better understood by referring to the following Detailed Description in conjunction with the accompanying drawings, in which like reference numerals indicate identical or functionally similar elements.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to limit the embodiments described. On the contrary, the embodiments are intended to cover all modifications, equivalents, and alternatives falling within the scope of the embodiments as defined by the appended claims.

DETAILED DESCRIPTION

Overview

Technology is disclosed for compact circuit board ejector systems ("the technology") that facilitate the removal and insertion of circuit boards from a server chassis. In various embodiments, a circuit board ejector system includes a chassis, a circuit board removably housed in the chassis, and one or more circuit board ejectors. In various embodiments, the circuit board ejectors each include a hub rotatably mountable to the chassis and at least one ejector tooth extending from the hub. A lever is connected or coupled to the hub, wherein the ejector tooth is mateable with the circuit board, whereby movement of the lever causes the tooth to move the circuit board.

In various embodiments, the ejector teeth are mateable with notches located along an edge of the circuit board. In some embodiment, notches are located along opposite edges of the circuit board. In some embodiments, the notches are formed into the circuit board. In other embodiments, the notches are formed into racks attached to the edge of the circuit board. In some embodiments, the ejector teeth are in the form of involute profile gear teeth. In some embodiments, each circuit board ejector includes a plurality of gears coupling or connecting the lever and the hub. In various embodiments, the system includes at least one actuator coupled or connected to one or more of the hubs.

General Description

Various examples of the devices introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

Figure 1:
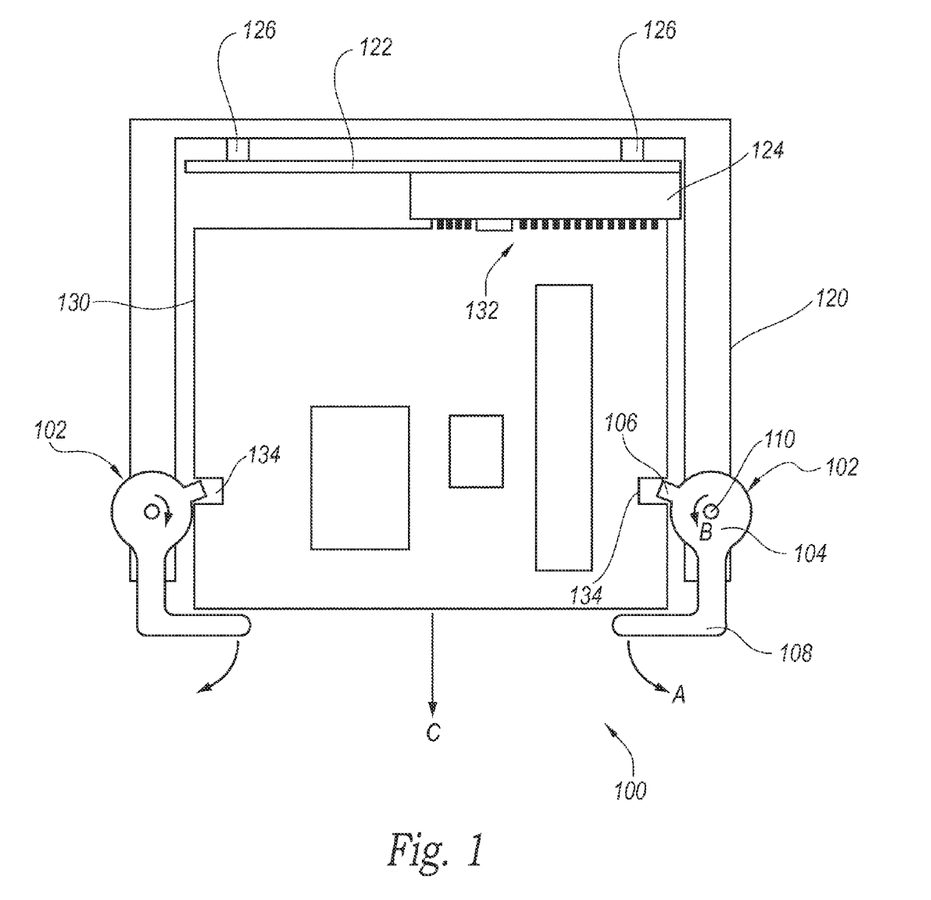
FIG. 1 is a top plan view illustrating a circuit board ejector system according to a representative embodiment of the present technology.

FIG. 1 illustrates a circuit board ejector system 100 according to a representative embodiment. The ejector system 100 includes a circuit board 130, such as a printed circuit board, that includes a plurality of electrical contacts 132. Contacts 132 are inserted into or otherwise removably and operably coupled to a connector 124 that is mounted to a backplane circuit board 122. The backplane circuit board 122 is mounted to chassis 120 via standoffs 126. The circuit board 130 is movable relative to the chassis 120 between an installed position (wherein the electrical contacts 132 are in operative engagement with the connector 124) and an ejected position (wherein the circuit board 130 is spaced apart from the connector 124 with the electrical contacts 132 disengaged from the connector).

A pair of circuit board ejectors 102 are rotatably mounted to chassis 120 on pins 110. Each circuit board ejector 102 includes a hub 104 with at least one ejector tooth 106 extending from the hub. Lever 108 extends from the hub 104 and provides a finger hold for a user to grasp. The hub 104 and tooth 106 as illustrated rotate in a plane parallel to or coincident with the plane of the circuit board, although other embodiments can provide a different angular orientation between circuit board and hub/tooth. Circuit board 130 includes a pair of notches 134 formed along opposite edges of the circuit board. Ejector tooth 106 is mateable with notch 134 whereby movement of lever 108 causes ejector tooth 106 to engage the portion of the printed circuit board defining the notch, such that continued rotary movement of the tooth moves the circuit board in a selected direction toward or away from the connector 124. Accordingly, this rotational movement of the ejector 102 moves the circuit board 130 relative to the back plane, which causes the contacts 132 to selectively move into or out of the connector 124. For example, as a user moves lever 108 as indicted by arrow A, hub 104 rotates as indicated by arrow B, and as a result ejector tooth 106 engages notches 134 causing circuit board 130 to move out of the chassis 120 as indicated by arrow C. This procedure can be reversed to move the circuit board 130 into the chassis towards connector 124. Thus, rotation of the ejectors 102 moves the circuit board between the installed and ejected positions (inclusive). The ejector 102 can be used to fully install the circuit board 130 so the contacts 132 are fully inserted into the connector 124, such that the ejector can be used as a visual indicator confirming to a user the position of the circuit board relative to the installed/ejected positions. In some embodiments, the ejector 102 can include a locking feature that prohibits involuntary or accidental movement of the ejector, thereby protecting against the circuit board disconnecting from the connector. While the "ejector" is used for ejecting the circuit board, it is to be understood that the ejector device is also usable to move the circuit board into the chassis to the fully installed position.

Figure 2:
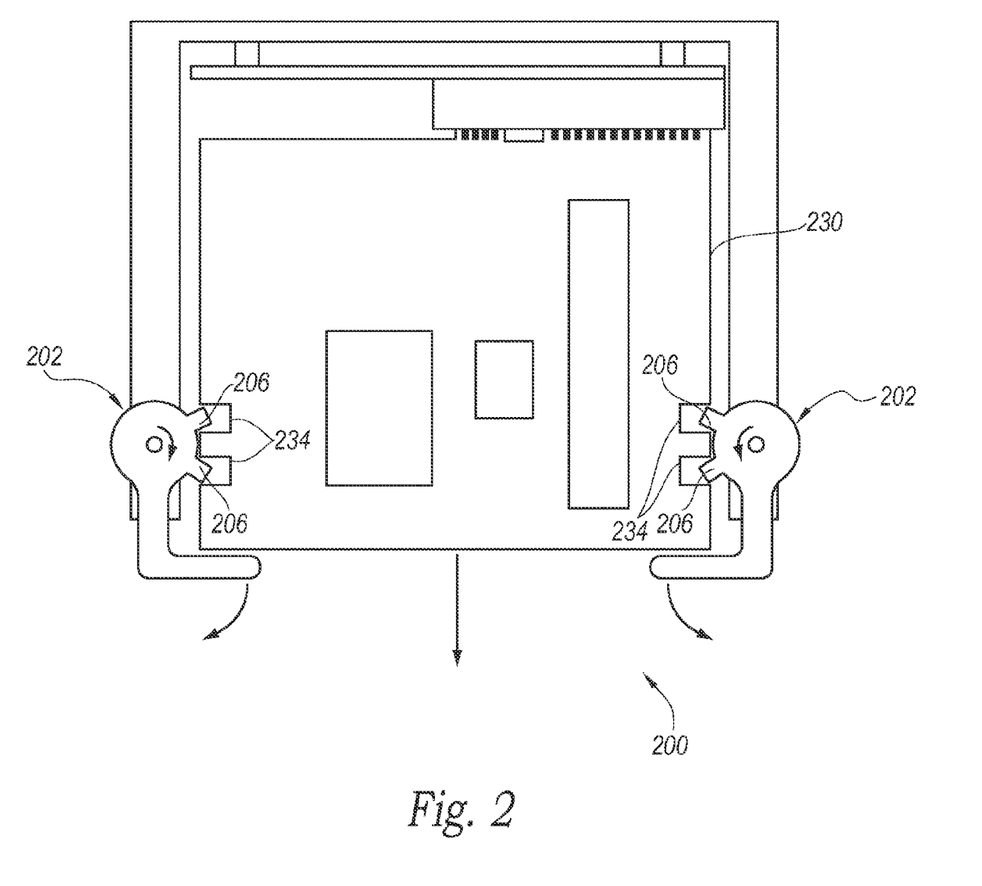
FIG. 2 is a top plan view illustrating a circuit board ejector system according to another representative embodiment.

FIG. 2 illustrates a circuit board ejector system 200 according to another representative embodiment. Circuit board ejector system 200 is similar to that shown with respect to FIG. 1; however, in this embodiment, circuit board ejectors 202 each include a plurality of ejector teeth 206 that in turn engage a plurality of notches 234 formed along opposite edges of circuit board 230. Although the ejector teeth 206 are each shown as having a square profile, any suitable profile for the ejector teeth and notches can be used, such as involute profile gear teeth. The teeth 206 of the ejector and/or an engaging portion of the teeth can be made from plastic or other selected material that provides an engagement interface between the components described herein to safely provide force transfer to the printed circuit board 230 during ejection or installation without damaging the portion of the printed circuit board forming notches 234.

Figure 3:
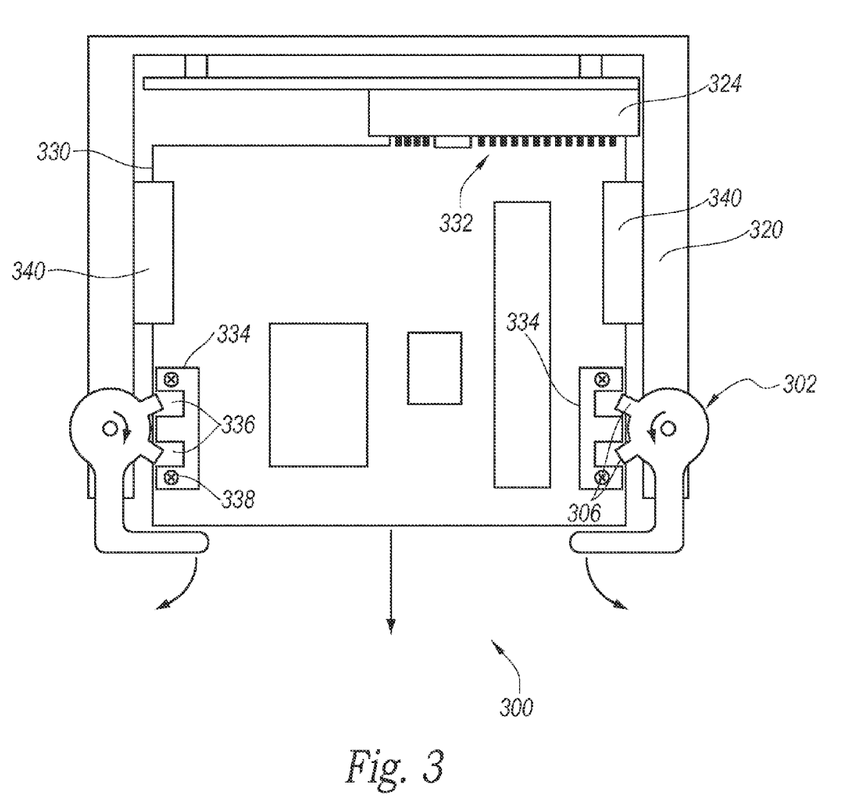
FIG. 3 is a top plan view illustrating a circuit board ejector system according to a further representative embodiment.

FIG. 3 illustrates a circuit board ejector system 300 according to a further representative embodiment. In this embodiment, circuit board ejector system 300 includes a pair of racks 334 disposed on opposite edges of circuit board 330. Accordingly, rather than engaging notches formed in circuit board 330, the circuit board ejector teeth 306 engage notches 336 formed in the racks 334. The racks 334 can be attached to the circuit board 330 by suitable fasteners 338, such as screws or rivets for example. Circuit board ejector system 300 can also include a pair of card guides 340, which are attached to chassis 320. Card guides 340 each include a channel that couples with or receives the edge of the circuit board 330 to facilitate guiding the contacts 332 into the connector 324. The illustrated embodiment shows two ejectors 302 that are rotated at substantially the same time and rate to help prevent canting or other misalignment of the printed circuit board 330 relative to the chassis 320 and the connector 324 during installation or removal. Another embodiment can use one ejector adjacent to one side of the printed circuit board, such as the side closest to the electrical contacts 332, and a roller or other alignment guide can be coupled to the chassis adjacent to the other side of the printed circuit board to help maintain alignment during installation and/or removal.

Figure 4:
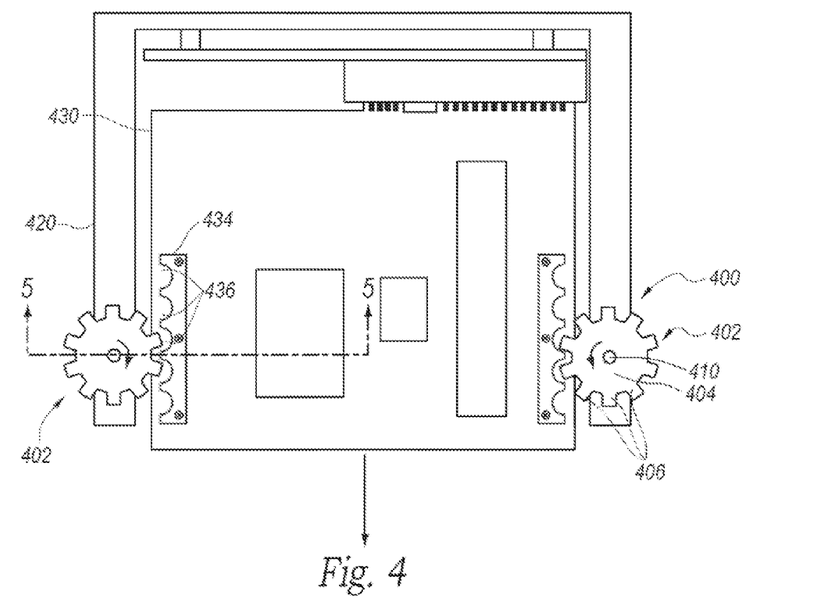
FIG. 4 is a top plan view illustrating a circuit board ejector system incorporating an actuator according to a representative embodiment.
Figure 5:
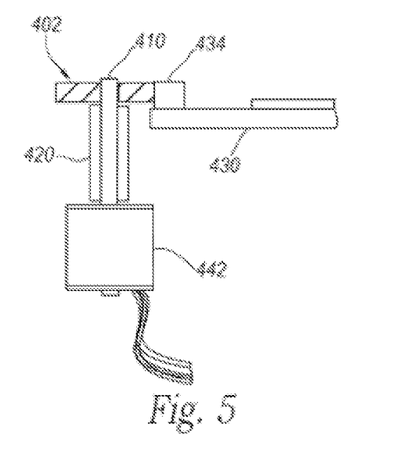
FIG. 5 is a front view in partial cross-section taken about line 5-5 in FIG. 4.

FIGS. 4 and 5 illustrate a circuit board ejector system 400 according to a representative embodiment. Circuit board ejector system 400 is operated by an actuator, such as an electric motor 442. In this embodiment, circuit board ejectors 402 are each in the form of a gear including a hub 404 and a plurality of teeth 406 disposed around the circumference of the hub. The hub 404 of circuit board ejector 402 is mounted to the output shaft 410 of electric motor 442. Accordingly, as motor 442 is activated, teeth 406 engage notches 436 formed in rack 434 (or, alternatively, notches formed in circuit board 430) to eject circuit board 430 from chassis 420. In some embodiments, the electric motor 442 is mounted to the chassis 420 as shown. Although the actuator is shown in this embodiment as an electric motor 442, other suitable actuators can be used, such as rotary solenoids, pneumatic actuators, linear actuators, and the like. Furthermore, it should be appreciated that each circuit board ejector 402 may be operated by a separate actuator. In other embodiments, the circuit board ejectors 402 can be geared together or otherwise coupled or connected such that a single actuator can operate both circuit board ejectors.

Figure 6:
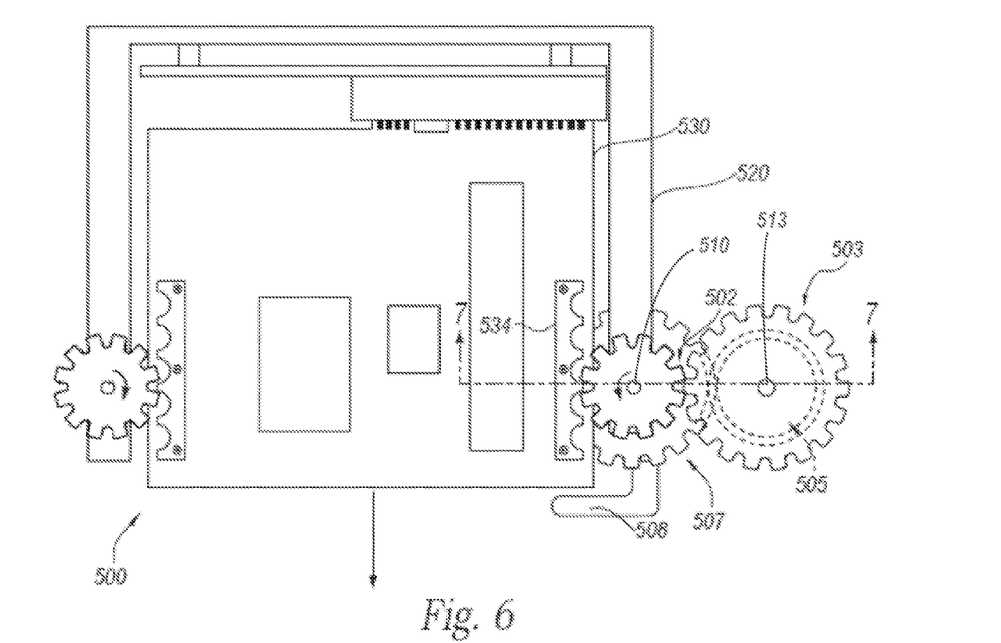
FIG. 6 is a top plan view of a circuit board ejector system incorporating a gear box according to a representative embodiment.
Figure 7:
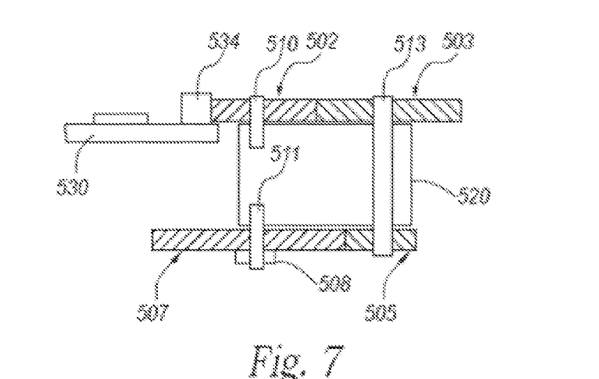
FIG. 7 is a front view in partial cross-section taken about line 7-7 in FIG. 6.

FIGS. 6 and 7 illustrate a circuit board ejector system 500, which includes a gear train (e.g., gear box) interconnecting lever 508 and circuit board ejector 502. Thus, movement of lever 508 is amplified according to selected gear ratios to rotate circuit board ejector 502. Lever 508 is coupled or connected to gear 507, both of which are mounted on axle 511. Thus, movement of lever 508 causes gear 507 to rotate. Gear 507 intermeshes with gear 505, which is attached to axle 513. Gear 503 is also attached to axle 513. Accordingly, rotation of gear 505 causes gear 503 to rotate the same number of revolutions. Circuit board ejector 502 is in the form of a gear that is rotatably mounted on axle 510 and intermeshes with gear 503. Rotation of gear 503 causes gear 502 to rotate and engage rack 534 (or, alternatively, circuit board 530) to eject or install circuit board 530.

In one representative embodiment, the gear ratio between gears 507 and 505 is 1:2. Thus, one revolution of gear 507 causes two revolutions of gear 505 and consequently two revolutions of gear 503. The gear ratio between gears 503 and 502 in this example is 1:1.5. Accordingly, one revolution of gear 503 causes 1.5 revolutions of gear 502. Thus, movement of lever 508 is amplified through the gear train according to the selected gear ratios. For example, a ¼ revolution of gear 507 resulting from a counterclockwise movement of lever 508 would cause gear 505 to rotate ½ of a revolution. Correspondingly, gear 503 would rotate ½ of a revolution, which in turn causes gear 502 to rotate ¾ of one revolution. Thus, a ¼ turn of lever 508 causes ¾ of a full revolution of gear 502. Although particular gear ratios are discussed with respect to FIGS. 6 and 7, other suitable gear ratios may be selected as well. Furthermore, lever 508 or gear 507 can be operated by any suitable actuator.

Figure 8:
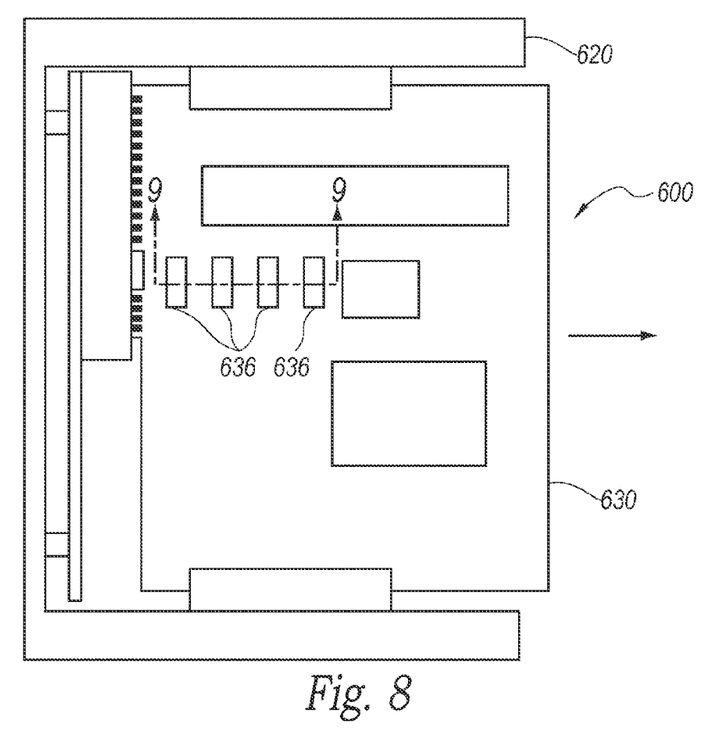
FIG. 8 is a top plan view of a circuit board ejector system according to yet another representative embodiment.
Figure 9:
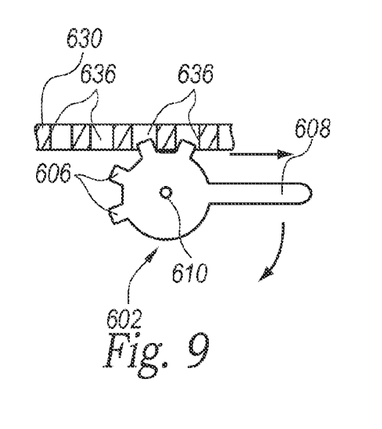
FIG. 9 is a side view and partial cross-section taken about line 9-9 in FIG. 8.

FIG. 8 illustrates a circuit board ejector system 600 according to yet another representative embodiment. In this embodiment, circuit board 630 includes a plurality of notches 636 formed through the circuit board on an interior region of the circuit board. The notches 636 are in the form of rectangular holes formed through the circuit board. As shown in FIG. 9, a circuit board ejector 602 is mateable with notches 636 whereby movement of lever 608 causes ejector teeth 606 to engage notches 636 to eject circuit board 630 from the chassis 620. As shown in the figure, circuit board ejector 602 rotates about axle 610, which is positioned below circuit board 630. Although circuit board ejector 602 is shown below circuit board 630, in some embodiments the ejector 602 can be positioned above the circuit board.

Figure 10:
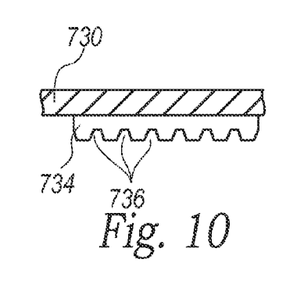
FIG. 10 is a partial cross-section illustrating another representative embodiment similar to that shown in FIGS. 8 and 9.

FIG. 10 illustrates a circuit board ejector system 700 that is similar to embodiment 600 disclosed above with respect to FIGS. 8 and 9; however, in this embodiment circuit board 730 includes a rack 734 including notches 736 disposed on the bottom side of the circuit board 730. Accordingly, a circuit board ejector can engage notches 736 in rack 734 rather than notches that are formed through the circuit board.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A circuit board ejector for installing or ejecting a circuit board from a chassis, the circuit board ejector comprising:
    a hub rotatably mountable to a chassis;
    a plurality of ejector teeth extending from the hub; and
    a lever coupled to the hub by a plurality of gears;
    wherein the plurality of ejector tooth teeth are mateable with a circuit board housed in the chassis, whereby movement of the lever causes the teeth to move the circuit board, wherein the at least one ejector tooth is mateable with at least one notch formed along an edge of the circuit board, whereby movement of the lever causes the tooth to move the circuit board.

2. The circuit board ejector of claim 1, wherein the plurality of ejector teeth are in the form of square profile gear teeth.

3. A circuit board ejector system, comprising:
    a chassis;
    a circuit board housed in the chassis;
    a circuit board ejector, comprising:
        a hub rotatably coupled to the chassis;
        at least one ejector tooth extending from the hub; and
        a lever coupled to the hub;
    wherein the at least one ejector tooth is mateable with at least one notched formed along an edge of the circuit board, whereby movement of the lever causes the tooth to move the circuit board.

4. The system of claim 3, wherein the at least one notch is formed into a rack coupled to the circuit board adjacent to the edge.

5. The system of claim 4, wherein the rack includes a plurality of teeth.

6. The system of claim 3, including a second circuit board ejector mateable with the circuit board, wherein the circuit board ejectors are disposed on opposed sides of the circuit board.

7. The system of claim 6, wherein each circuit board ejector mates with one or more notches formed along an edge of the circuit board.

8. The system of claim 7, wherein each circuit board ejector includes a plurality of ejector teeth extending from the respective ejector's hub.

9. The system of claim 8, wherein the plurality of ejector teeth are in the form of square profile gear teeth.

10. The system of claim 7, wherein each circuit board ejector includes a plurality of gears coupling the respective ejector's lever and hub.

11. A circuit board ejector system, comprising:
    a chassis;
    a circuit board housed in the chassis and including a plurality of notches formed along opposite edges of the circuit board;
    a pair of card guides disposed on opposite sides of the circuit board;
    a pair of circuit board ejectors positioned on opposite sides of the circuit board,
        each circuit board ejector comprising:
            a hub rotatably coupled to the chassis; and
            a plurality of ejector teeth extending from the hub;
    wherein the plurality of ejector teeth are mateable with the plurality of notches, whereby rotation of the hubs causes the teeth to move the circuit board between an installed position and an ejected position.

12. The system of claim 11, further comprising a lever coupled to the hub of each circuit board ejector.

13. The system of claim 12, wherein each circuit board ejector includes a plurality of gears coupling the respective ejector's lever and the hub.

14. The system of claim 12, further comprising at least one actuator coupled to one or more of the hubs.

15. The system of claim 11, wherein the ejector teeth are in the form of square profile gear teeth.

16. A circuit board ejector system, comprising:
   a chassis;
   a circuit board housed in the chassis and including a plurality of notches formed along opposite edges of the circuit board;
   a pair of circuit board ejectors positioned on opposite sides of the circuit board, each circuit board ejector comprising:
      a hub rotatably coupled to the chassis;
      a lever coupled to the hub;
      a plurality of gears coupling the lever and the hub: and
      a plurality of ejector teeth extending from the hub;
   wherein the plurality of ejector teeth are mateable with the plurality of notches, whereby rotation of the hubs causes the teeth to move the circuit board between an installed position and an ejected position.

\* \* \* \* \*